United States Patent [19]
Tomioka

[11] Patent Number: 5,775,923
[45] Date of Patent: Jul. 7, 1998

[54] PC CARD CONNECTOR

[75] Inventor: Shoichi Tomioka, Tokyo, Japan

[73] Assignee: Hirose Electric Co., Ltd., Tokyo, Japan

[21] Appl. No.: 670,020

[22] Filed: Jun. 25, 1996

[30] Foreign Application Priority Data

Jul. 5, 1995 [JP] Japan .................. 7-191049

[51] Int. Cl.$^6$ .................................................. H01R 9/09
[52] U.S. Cl. .................................... 439/79; 439/541.5
[58] Field of Search .......................... 439/607, 604, 439/79, 80, 541.5

[56] References Cited

U.S. PATENT DOCUMENTS

| | | | |
|---|---|---|---|
| 3,736,471 | 5/1973 | Donze et al. | 317/101 D |
| 4,964,806 | 10/1990 | Sakamoto et al. | 439/79 |
| 5,225,968 | 7/1993 | Ma | 439/541.5 |
| 5,334,046 | 8/1994 | Brouilett et al. | 439/541.5 |
| 5,399,105 | 3/1995 | Kaufman et al. | 439/609 |

FOREIGN PATENT DOCUMENTS

| | | |
|---|---|---|
| 2558975 | 8/1985 | France . |
| 9621257 | 7/1996 | WIPO . |

*Primary Examiner*—Neil Abrams
*Assistant Examiner*—Barry Standig
*Attorney, Agent, or Firm*—Kanesaka & Takeuchi

[57] ABSTRACT

A plurality of contact elements (5) extend through a support member (4) and having a connection portion (5A) on the PC card side and a wiring portion on the side opposite to the PC card side. The wiring portions (5B) are connected to corresponding signal circuits of a connection board (7). The ground member (6) has on the non-PC card side a connection leg (6A) connected to a ground circuit of the connection board 7, which is designed to be fitted into an intermediate connector 9 for connection with a circuit of the equipment.

8 Claims, 6 Drawing Sheets

PC CARD CONNECTOR

BACKGROUND OF THE INVENTION

1. Field of the Invention

The present invention relates to PC card connectors.

2. Description of Prior Art

PC card connectors receive PC cards. Contact elements of the PC card connectors for contact with contact elements of the PC cards have wiring portions which are bent to project under the housing. When the PC card connectors are mounted on circuit boards of equipment, the wiring portions are soldered to corresponding conductors of the circuit boards.

Such a connector is described in U.S. Pat. No. 5,288,247. As shown in FIG. 7, a housing 51 includes a pair of guide sections 52 for receiving a PC card P in a direction of A. A rear wall 53 of the housing supports a plurality of contact elements 54 and 55 in two tiers. The contact elements 54 and 55 have contact portions 54A and 55A on the PC card side and are bent downwardly at a rear side with respect to the rear wall 53 to form wiring portions 54B and 55B. The wiring portions 54B and 55B are arranged in a zigzag fashion for connection with a circuit board. Guide holes 56A of a guide board 56 guide the wiring portions 54B and 55B to accurate positions.

A plate-like ground member 57 is provided over the housing 51. The left portion of the ground plate 57 is folded back to form a contact portion 57A. The contact portion 57A is cantilevered and has a spring property so that when a PC card is inserted, it makes a resilient contact with a ground portion of the PC card.

The ground member 57 is bent so as to cover the rear wall 53 on opposite sides and has a connection leg 57B for connection with a ground circuit of equipment. As shown by phantom line in FIG. 7, U.S. Pat. No. 5,288,247 also discloses that the ground member 57 is bent downwardly at the right end so as to cover the wiring portions 54B and 55B of the contact elements 54 and 55.

Thus, the contact elements 54 and 55 are shielded by the ground member 57.

In the above conventional PC card connector, the ground member 57 is placed over the contact elements 54 and 55 to provide shielding effects. When the ground member has the portion 57C as shown by phantom line, the shielding effects are enhanced.

However, the wiring portions are arranged in a zigzag fashion for facilitating the soldering operation of a large number of contact elements which are closely packed. Even if the ground member 57 has the shield portion 57C, the wiring portions 54B, especially at the left side, are spaced apart from the shield portion 57C, thereby having poor shielding effects.

SUMMARY OF THE INVENTION

Accordingly, it is an object of the invention to provide a PC card connector having excellent shielding effects on the wiring portions of contact elements to thereby meet high speed transmission requirements.

It is another object of the invention to provide a removable PC card connector capable of being plugged in and out of a circuit board.

It is still another object of the invention to provide a PC card connector capable of receiving a plurality of PC cards.

PC cards to be connected to the PC card connector according to the invention have a plurality of contact elements in a front side and a plurality of connection holes for receiving contact elements of the connector.

The PC card connector according to the invention includes a housing having a pair of guide sections for guiding opposite sides of such a PC card as described above. A support member made from an insulation material between the guide sections in a rear portion of the connector for support of a plurality of contact elements which are brought into contact with the contact elements of the connector.

The contact elements have a substantially straight configuration extending parallel to the inserting direction of a PC card.

DESCRIPTION OF THE PREFERRED EMBODIMENT

Embodiments of the invention will now be described with reference to the accompanying drawings.

Figure 1:
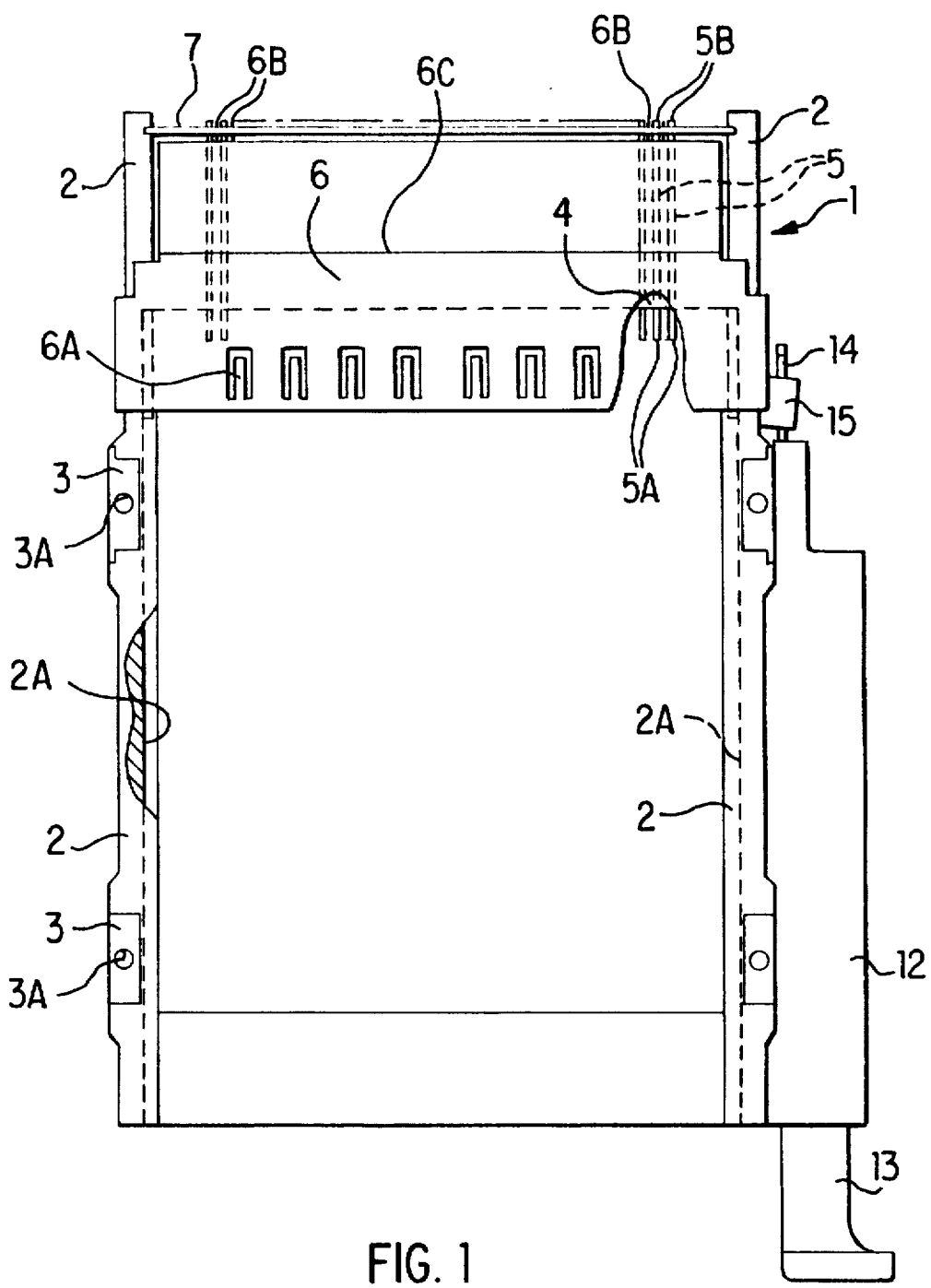
FIG. 1 is a top plan view of a PC card connector according to a first embodiment of the invention.

FIG. 1 shows a top plan view of a PC card connector according to a first embodiment of the invention. The connector 1 has a pair of guide sections 2 made from an insulating material and extend in parallel to each other. A pair of guide channels 2A extend in the guide sections 2 so as to face each other for guiding a PC card which is inserted upwardly from a lower position in the figure.

Mounting faces 3 extend outwardly from the guide sections 2 in a plane parallel to the sheet for placing a number of connectors one upon another. Through holes 3A are provided in the mounting faces 3 for receiving screws to unite the connectors.

Figure 2:
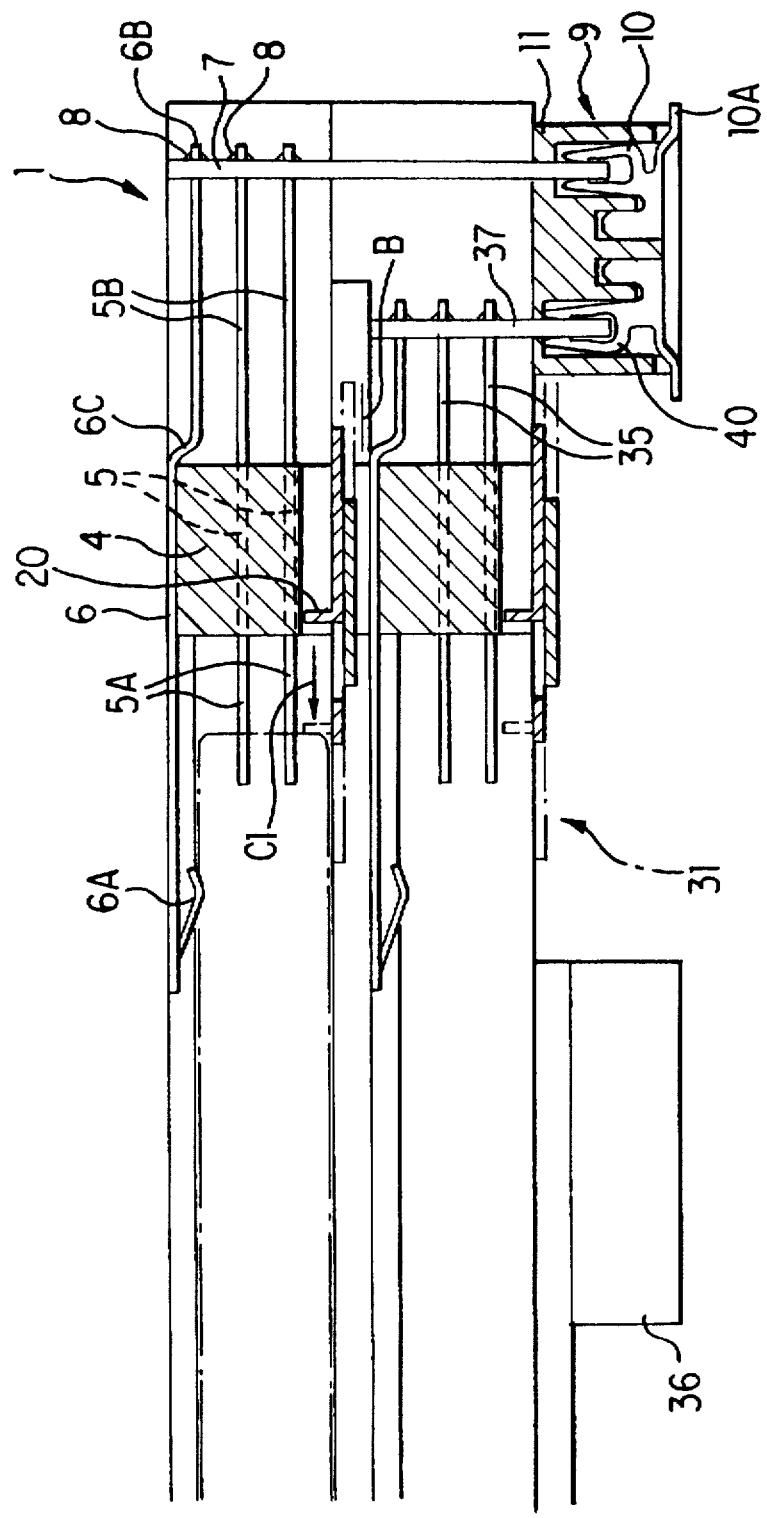
FIG. 2 is a sectional view of an essential part of the connector of FIG. 1.

A support member 4 of an insulating material links the guide sections 2 on the rear portion (upper portion in the figure). A number of straight contact elements 5 extend through the support member 4 and have a connection portion 5A for connection to a PC card and a wiring portion 5B on the side opposite to the connection portion. The contact elements 5 are disposed in two tiers as shown in FIG. 2.

Figure 3:
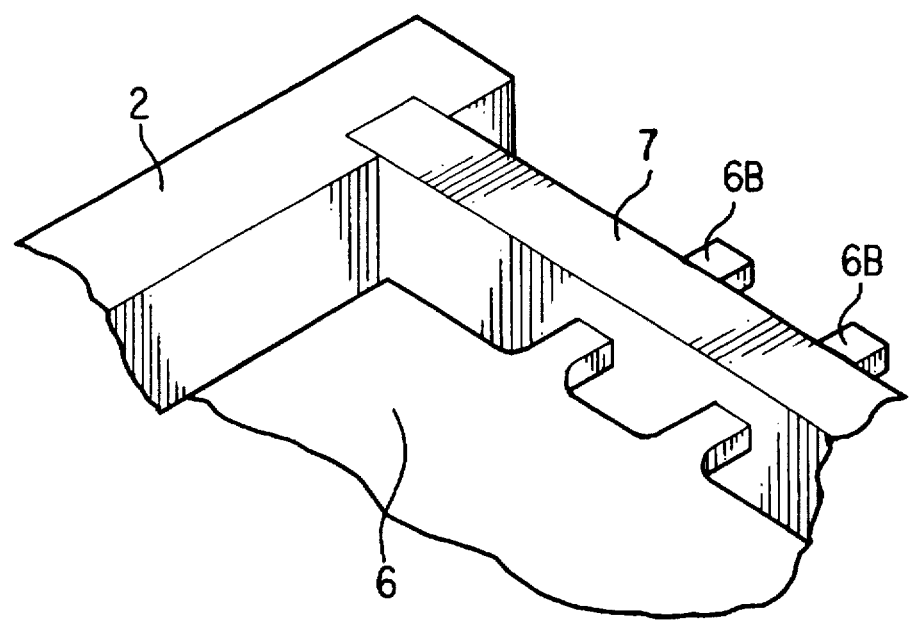
FIG. 3 is an enlarged perspective view of a ground member and a connection board of the connector of FIG. 1.

A ground member 6 is provided on the support member 4. The ground member 6 is made from a substantially flat metal sheet as shown in FIGS. 1–2 and extends across the guide sections 2 and forward beyond the connection portion 5A and rearwardly up to the wiring portions 5B. A number of resilient ground tabs 6A extend diagonally rearward from the front portion of the ground member 6 by means of C-shaped cutouts. See also FIG. 2. Leg portions 6B extend rearward from the ground member 6 as shown in FIG. 3. As best shown in FIG. 2, a bend portion 6C is provided between the support member 4 and the leg portions 6B so that the leg portions 6B become close to the wiring portions 5B.

The wiring portions 5B of the contact elements 5 and the leg portions 6B of the ground member 6 are soldered to the signal and ground circuits, respectively, of a connection board 7 which extends in a plane perpendicular to the extension direction of the wiring portions 5B and the leg portions 6B. The signal and ground circuits may be formed on both sides of the connection board 7. Where they are formed on one side, it is preferred that the ground circuit is formed between the signal circuits. Where the signal and ground circuits are formed on different sides, it is preferred that the ground circuit is formed over the substantially entire surface.

The connection board 7 is plugged in an intermediate connector 9. Contact pads of the signal and ground circuits are disposed on the lower portion of the connection board 7 at regular intervals in a direction perpendicular to the sheet in FIG. 2. Contact elements 10 are arranged in the intermediate connector 9 at intervals corresponding to those of the connection board 7 for contact with the contact pads. The contact elements 10 are disposed in an insulation housing 11 and have a U-shaped portion for receiving the contact pads of the connection board 7. Leg portions 10A of the contact elements 10 extends laterally beyond the housing 11 for connection to a predetermined circuit of a circuit board when the intermediate connector is disposed in a predetermined position on a circuit board of equipment.

Figure 4:
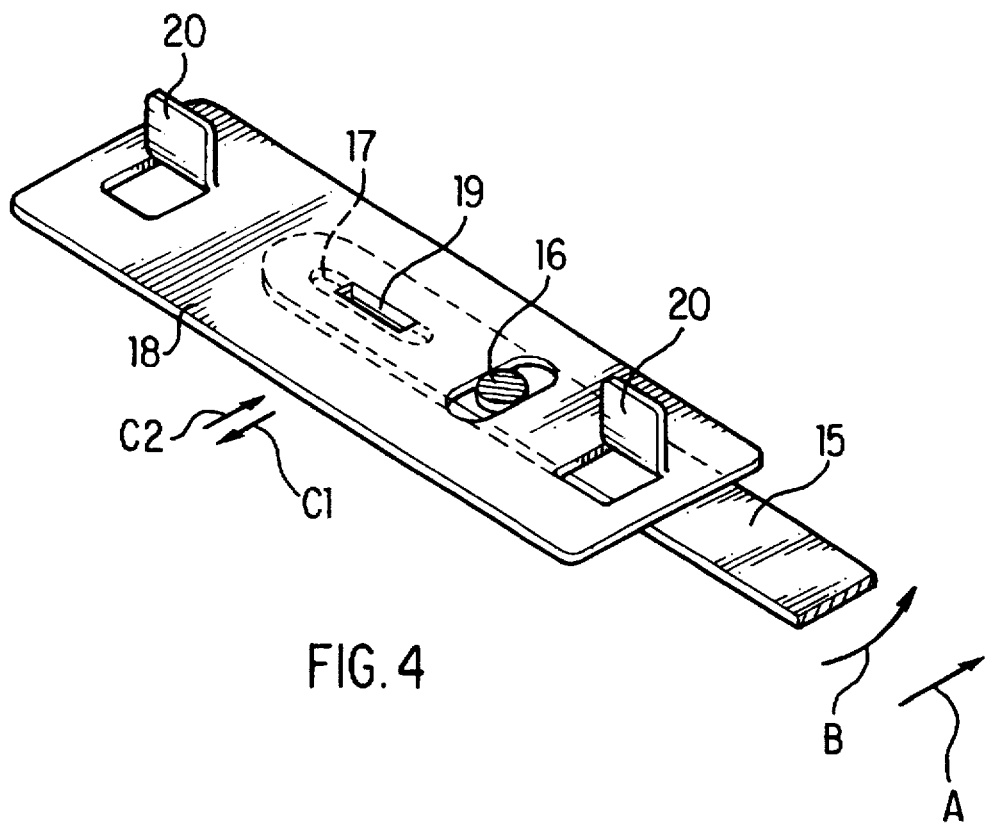
FIG. 4 is a perspective view of an ejector lever and a plate of the connector of FIG. 1.

In FIG. 1, a PC card ejector includes a guide cylinder 12 provided along one of the guide sections 2, a push button 13 disposed in the guide cylinder 12, and an ejector bar 14 connected to the push button 13 such that when the push button 13 is depressed, the ejector bar 14 is moved rearward. An ejector lever 15 is rotatably connected to the ejector bar 14. The ejector lever 15 extends under the support member 4 and rotates about a stud 16 which extends downwardly from the support member 4. In FIG. 4, when the ejector lever 14 is pushed in a direction A, it rotates about the stud 16 in a direction B. A slit 17 is provided in an end portion of the ejector lever 15 while a movable plate 18 is provided for sliding movement under the support member 4 along the guide sections 2 in directions C1 and C2 in FIGS. 2 or 4. An engaging tab 19 extends downwardly from the central portion of the movable plate 18 for engagement with the slit 17 of the ejector lever 15. A pair of pushing tabs 20 extend upwardly from both end portions of the movable plate 18 for abutment with the leading end of an inserted PC card. When the ejector lever 15 rotates in the direction B, the pushing tabs 20 are moved in the direction C1 by means of the engaging tab 19. As a result, the connection between the PC card and the connector is released so that the PC card can be removed.

In FIG. 2, another connector 31 of the same type as the connector 1 is provided under the connector 1 to form a two-tier structure. The wiring portions 35 of contact elements in the lower connector 31 are shorter than those of the upper connector 1 and are connected to a separate connection board 37 which is shorter than the connection board 7 for the upper connector 1. The intermediate connector 9 has other contact elements 40 for receiving the connection board 37.

A protruded base 36 extends downwardly from a housing of the lower connector 31 for mounting the connector on a circuit board in cooperation with the intermediate connector 9 and assuring connection of the wiring portions 35 to circuitry of the circuit board.

The connectors 1 and 31 for connecting PC cards to the circuitry of equipment are shielded by the ground plate 6 and the connection boards 7 and 37, respectively. Since the signal circuit is close to the ground circuit on the connection board, very effective shielding is obtained.

Figure 5:
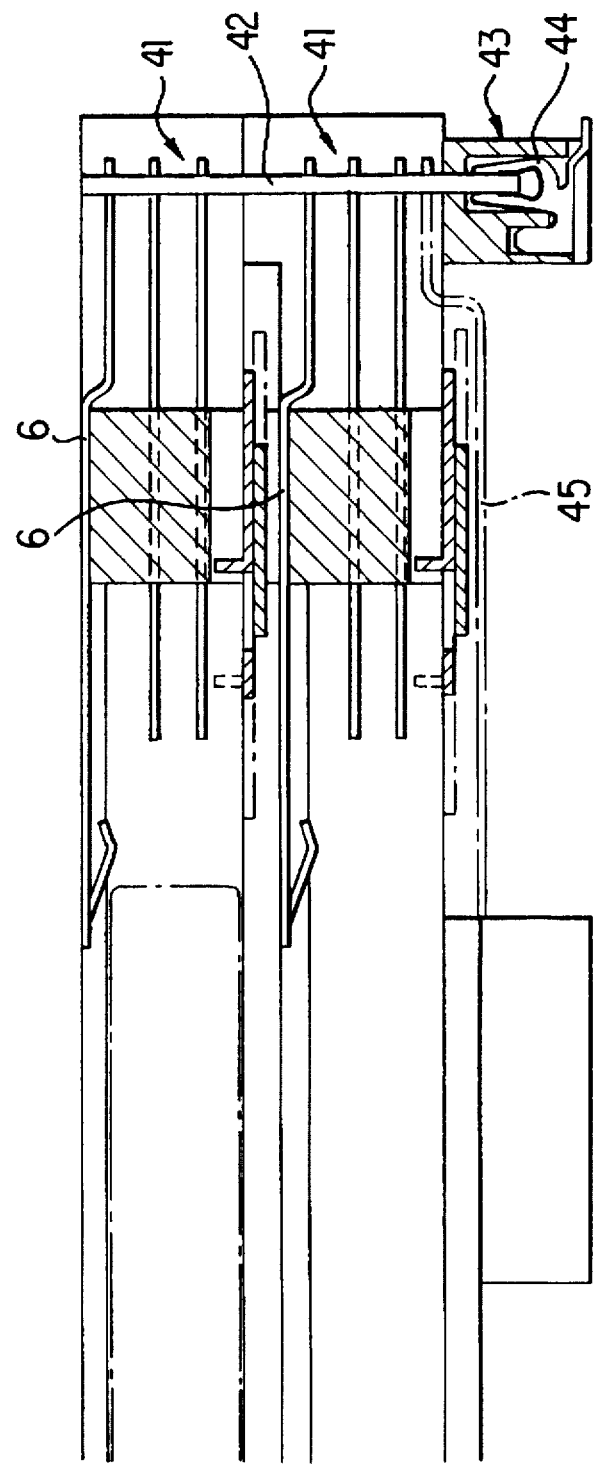
FIG. 5 is a sectional view of a PC card connector according to a second embodiment of the invention.

A second embodiment is shown in FIG. 5 wherein two completely identical connectors 41 are used to eliminate the necessity for use of connectors having different wiring portions as shown in FIG. 2. In addition, it is sufficient to provide only one common connection board 42. It follows that an intermediate connector 43 is simplified and that contact elements 44 can be arranged in a row.

As shown by phantom line in FIG. 5, another ground member 45 is provided under the lower connector 41 to provide complete shielding for the two connectors in cooperation with the upper ground members 6.

Figure 6:
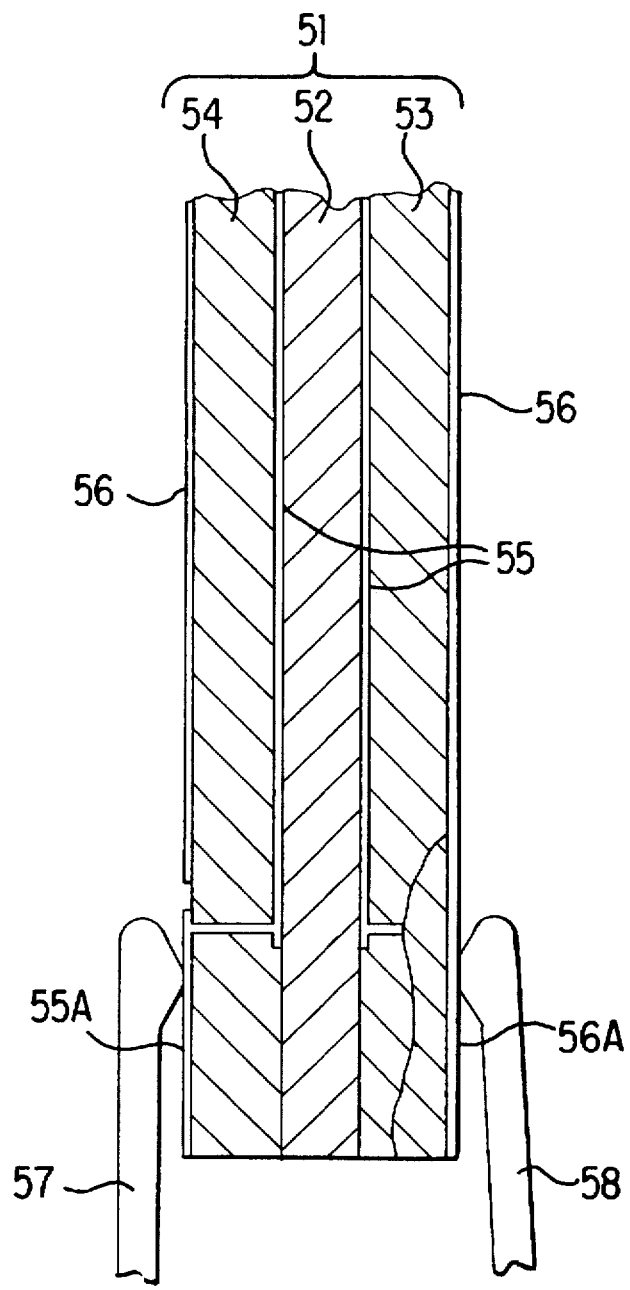
FIG. 6 is a sectional view of a connection board according to a third embodiment of the invention.
Figure 7:
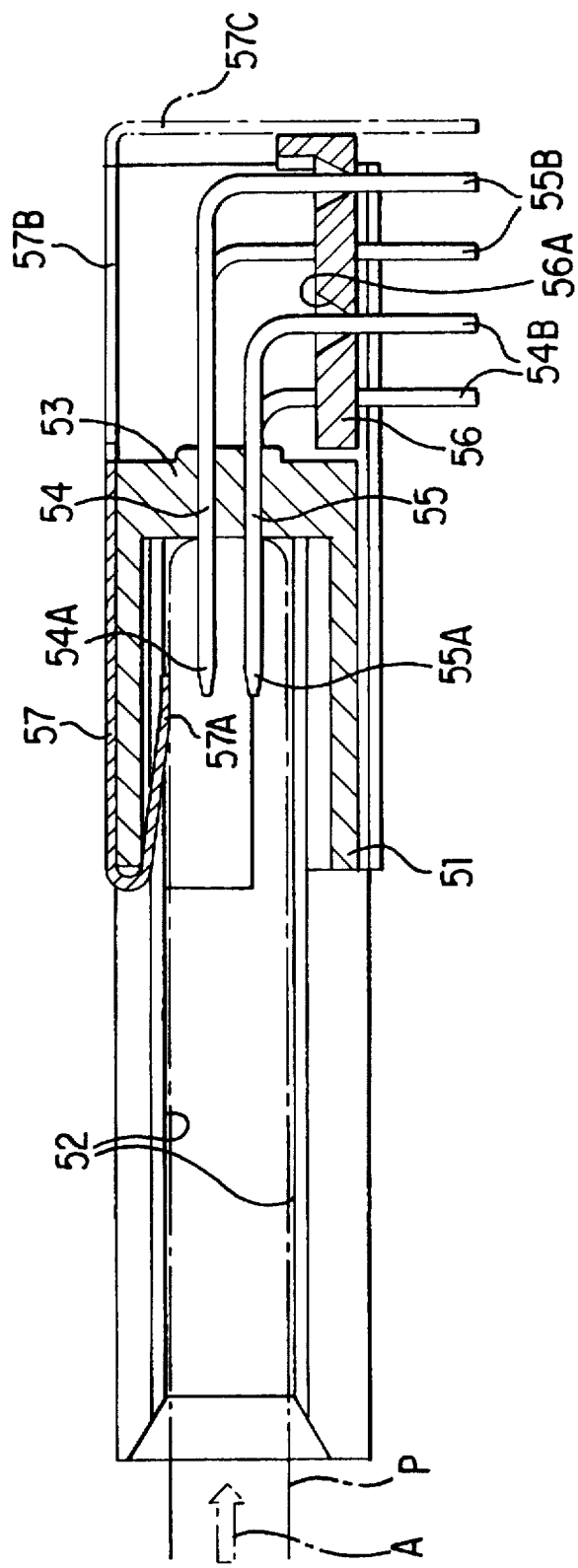
FIG. 7 is a sectional view of a conventional connector.

By making the connection board of multiple layers, it is possible to further enhance the shield effects. In FIG. 6, a connection board 51 is made up of an intermediate layer 52 and a pair of outer layers 53 and 54 provided on opposite sides of the intermediate layer 52. The intermediate and outer layers 52, 53, and 54 are made from an insulation material. Signal circuits 55 are formed between the outer layers 53 and 54 and the intermediate layer 52 while ground circuits or surfaces 56 are formed on the outside of the outer layers 53 and 54. The signal circuits 55 are connected to contact portions 55A which are formed on the outside of the outer layers and brought into contact with contact elements 57 of the intermediate connector. Contact portions 56A of the ground surfaces 56 extend downwardly between the connection portions 55A of the signal circuits 55 and come into contact with contact elements 58 of the intermediate connector.

The ground surfaces 56 cover almost all of the outer layers, thus providing better shielding effects than the above embodiment.

As described above, according to the invention, the connection portions of contact elements for a PC card connector are brought into contact with the connection board, which is plugged in the intermediate connector mounted on a circuit board of equipment so that the ground and signal circuits of the connection board are so close to each other as to provide good shielding effects and high speed transmission. In addition, by plugging out of the intermediate connector it is easy to repair the circuitry. A number of identical connectors can be placed one upon another, and only one common connection board is necessary. The multiple layered structure provides better shielding effects.

What is claimed is:

1. A PC card connector for a PC card having a plurality of first contact elements such that contact portions of said first contact elements are arranged in a front area of said PC card and a ground portion provided at a front portion of said PC card, comprising:

a housing having a pair of guide sections for guiding opposite sides of said PC card;

a support section extends between said guide sections in a rear area of said housing;

a plurality of substantially straight second contact elements extend through said support section for contact with said first contact elements;

a ground member supported by said housing so as to extend along said second contact elements;

said second contact elements having a contact portion on a first side where said PC card is provided and a wiring portion on a second side opposite to said first side with respect to said support section;

a connection board provided on said second side at substantially right angles with said second contact elements and having a signal circuit for connection with said wiring portion; and said ground member having a leg portion on said second side for wiring to a ground circuit of said connection board.

2. A PC card connection according to claim 1, wherein said connection board comprises an intermediate layer on which a signal circuit is provided and an outer layer having an outside, a ground surface provided on said outside except for a portion of said outside, to which an end portion of said signal circuit is connected, for connection with contact elements of said intermediate connector.

3. A PC card connector according to claim 1, which further comprises an intermediate connector for connecting said connection board to a circuit of equipment.

4. A PC card connector comprising:

a plurality of housings placed one upon another;

a plurality of substantially straight contact elements arranged in each of said housings and having wiring portions;

a ground member provided on each of said housings so as to extend alone said contact elements and having leg portions; and a plurality of connection boards provided at right angles with and arranged at different positions in a longitudinal direction of said contact elements and connected to said wiring portions of said contact elements and said leg portions of said around member.

5. A PC card connection according to claim 4, wherein said connection board comprises an intermediate layer on which a signal circuit is provided and an outer layer having an outside, a ground surface provided on said outside except for a portion of said outside, to which an end portion of said signal circuit is connected, for connection with contact elements of said intermediate connector.

6. A PC card connector according to claim 4, which further comprises a single common intermediate connector for connecting said connection boards to a circuit of equipment.

7. A PC card connector comprising:

a plurality of housings placed one upon another for each receiving a PC card;

a plurality of substantially straight contact elements arranged in each of said housings and having wiring portions;

a plurality of ground members provided on said housings extending along said contact elements; and a common connection board provided at right angles with said contact elements for connection with said wiring portions and said ground members.

8. A PC card connection according to claim 7, wherein said connection board comprises an intermediate layer on which a signal circuit is provided and an outer layer having an outside, a ground surface provided on said outside except for a portion of said outside, to which an end portion of said signal circuit is connected, for connection with contact elements of said intermediate connector.

* * * * *